(12) United States Patent
Tanimoto et al.

(10) Patent No.: US 7,117,459 B2
(45) Date of Patent: Oct. 3, 2006

(54) LAYOUT CHECK SYSTEM

(75) Inventors: Shinichi Tanimoto, Souraku-gun (JP); Syoichi Mimura, Hirakata (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 398 days.

(21) Appl. No.: 10/719,774

(22) Filed: Nov. 21, 2003

(65) Prior Publication Data

US 2004/0148581 A1 Jul. 29, 2004

(30) Foreign Application Priority Data

Nov. 26, 2002 (JP) ............................ 2002-342009

(51) Int. Cl.
*G06F 17/50* (2006.01)
(52) U.S. Cl. .................... 716/4; 716/5; 716/6
(58) Field of Classification Search .............. 716/4–6
See application file for complete search history.

(56) References Cited

U.S. PATENT DOCUMENTS

| | | | | |
|---|---|---|---|---|
| 5,627,476 A | * | 5/1997 | Chambers | 324/704 |
| 6,297,965 B1 | * | 10/2001 | Sasaki et al. | 361/782 |
| 6,447,694 B1 | * | 9/2002 | Lee et al. | 252/79.1 |
| 6,546,528 B1 | * | 4/2003 | Sasaki et al. | 716/5 |
| 6,571,184 B1 | * | 5/2003 | Anderson et al. | 702/65 |
| 6,631,509 B1 | | 10/2003 | Nakayama et al. | |
| 6,674,338 B1 | * | 1/2004 | Novak | 333/32 |
| 2001/0010035 A1 | * | 7/2001 | Yaguchi et al. | 703/18 |
| 2004/0015804 A1 | | 1/2004 | Nakayama et al. | |

FOREIGN PATENT DOCUMENTS

| | | |
|---|---|---|
| JP | 2001-282882 | 10/2001 |
| JP | 2002-016337 | 1/2002 |

* cited by examiner

*Primary Examiner*—Thuan Do
*Assistant Examiner*—Naum Levin

(57) ABSTRACT

A layout check system checks whether a layout of a power source, a component including a power pin, and a bypass capacitor on a PCB and defined by layout data created using a CAD system allows the bypass capacitor to function effectively. A storage unit stores the layout data that includes information used as a basis to calculate a first value corresponding to impedance between the power pin and the power source and a second value corresponding to impedance between the power pin and the bypass capacitor. A calculation unit calculates the first value and the second value with use of the information. A judgment unit judges whether the layout allows the bypass capacitor to function effectively, by comparing the first value with the second value. When a result of the judgment is negative, an output unit outputs error information.

10 Claims, 15 Drawing Sheets

FIG.9

| BYPASS CAPACITOR COMPONENT NUMBER | COMPONENT COORDINATES | NET NAME |
|---|---|---|
| 202 | (105,99) | N1001 |
| 203 | (105,96) | N1002 |
| 204 | (97,80) | N1003 |
| 205 | (104,80) | N1003 |
| ⋮ | ⋮ | ⋮ |

| WIRING IDENTIFIER | NET NAME | WIRING TYPE | VIA COORDINATES | WIRING WIDTH (mm) | STARTING POINT COORDINATES | ENDING POINT COORDINATES | WIRING LAYER NUMBER |
|---|---|---|---|---|---|---|---|
| 301 | N1001 | LINE | (101,99) | 0.15 | (99,99) | (104,99) | 1 |
| 302 | N1002 | LINE | (95,93) | 0.15 | (95,93) | (104,93) | 1 |
| 303 | N1003 | LINE | (100,81) | 0.15 | (97,81) | (103,81) | 1 |
| 304 | N1003 | LINE | — | 0.15 | (97,87) | (97,81) | 1 |
| 305 | N2001 | LINE | (101,107) | ... | (101,99) | (101,107) | 4 |
| ... | ... | ... | ... | ... | ... | ... | ... |

1000

LAYOUT CHECK SYSTEM

BACKGROUND OF THE INVENTION (1) Field of the Invention

The present invention relates to a CAD (computer aided design) technique used in layout design of a printed circuit board (hereinafter called a "PCB"), and in particular to a technique for checking whether the layout of a PCB defined according to layout data created using a CAD system will enable bypass capacitors positioned on the PCB to function effectively.

(2) Description of the Related Art

In recent years, high performance and digitalization of electronic devices has lead to the use of high-speed digital ICs (hereinafter called "high-speed IC(s)") as main structural components of such electrical devices.

A high-speed IC performs high-speed switching operations which cause high frequency fluctuations in the power source voltage and parasitic noise emission. For this reason, bypass capacitors are generally placed on the PCB on which a high-speed IC is mounted, positioned near the power pins of the high-speed IC.

Appropriate positioning of bypass capacitors stabilizes high frequency fluctuations caused in the voltage by high-speed switching, by supplementing with charge stored in the bypass capacitor, and also feeding high frequency components back to a GND pin of the high-speed IC so that parasite noise is confined to the area around the high-speed IC.

Positioning of components and wiring patterns to be mounted on a PCB is generally determined by a designer who using a CAD system. However, mistakes can occur in the positioning that prevent by pass capacitors from functioning effectively.

One technique for checking for mistakes in the layout is a "Wiring Structure Check System for Printed Board" (hereinafter simply called a "check system") disclosed in Japanese Laid-Open. Patent Application No. 2002-16337.

The check system determines that an error exists in wiring structure provisionally designed on a, PCB when the wiring structure fulfills one of several predetermined error conditions, such as conditions according to which the bypass capacitors will not function effectively. When an error exists, the check system displays an instruction regarding a measure that can be taken in relation to the error (hereinafter called an "error measure instruction").

Examples of cases in which the check system displays an error measure instruction are when a bypass capacitor is positioned corresponding to more than a predetermined number of high-speed IC power pins, and when a via exists on the wiring path between a bypass capacitor and a high-speed IC power pin.

However, there are a number of error conditions for which the above-described check system in unable to check.

One example is when a power via exists at a position that is on a wiring path connected to the power pin, but that is not on the path between the bypass capacitor and the high-speed IC power pin. The bypass capacitor will not function effectively in such a case.

In order for a bypass capacitor to function effectively, it is necessary for the impedance of the path between the power pin and the bypass capacitor to be lower than the impedance of the path between the power pin and the power source, so that the high-frequency current flows towards the bypass capacitor. However, if the wiring distance between the power via and the power pin is shorter than the wiring distance between the power pin and the bypass capacitor, the impedance between the power pin and the power source will be lower than the impedance between the power pin and the bypass capacitor, and the bypass capacitor may be unable to function effectively.

Since the above-described check system does not check whether a via exists on the wiring path between the bypass capacitor and the power pin of the high-speed IC, it is unable to check for this kind of error condition.

Furthermore, the check system displays an error measure instruction when a via exists on the path of a power pattern to which the bypass capacitor and the power pin of the high-speed IC are connected, even though this is not necessarily an error.

Although it would not be a problem for an error to be detected if a via is always connected to a power plane, if the via is connected not to a power plane but to a power pattern of the wiring, the impedance of the wiring between the via and the power source of the power pattern must be taken into consideration. In such a case, the impedance between the power pin and the power source is higher than the impedance between the power pin and the bypass capacitor, and therefore it is mistaken to always judge that an error exists.

SUMMARY OF THE INVENTION

The object of the present invention is to provide is to provide a layout check system, and techniques relating to the system, that is capable of checking more reliably than a conventional system whether a PCB layout is a layout that allows bypass capacitors on the PCB to function effectively.

In order to achieve the stated object, the present invention is a layout check system that checks layout data that defines a layout of a power source, a component that includes a power pin, and a bypass capacitor on a printed wiring board, including: a storage unit operable to store the layout data, the layout data including information used for calculating a first value and a second value, the first value corresponding to impedance between the power pin and the power source, and the second value corresponding to impedance between the power pin and the bypass capacitor; a calculation unit operable to calculate the first value and the second value, with use of the stored layout data; a judgment unit operable to judge, by comparing the first value with the second value, whether the layout allows the bypass capacitor to function effectively; and an output unit operable to output error information when a result of the judgment is negative.

Here, each of the values that correspond to impedance is a value other than the impedance itself, such as a wiring distance that is proportional to the impedance of the wiring.

The layout check system checks whether the layout allows the bypass capacitor to function effectively, by comparing a first value that corresponds to the impedance between the power pin and the power source with a second value that corresponds to the impedance between the power pin and the bypass capacitor. Therefore, the layout check system is able to judge errors more reliably than a conventional system.

Furthermore, the calculation unit may calculate, with use of the layout data, a shortest wiring distance between the power pin and the power source as the first value, and a shortest wiring distance between the power pin and the bypass capacitor as the second value, and the judgment unit may judge that the layout does not allow the bypass capacitor to function effectively if the first value is less than the second value.

According to the stated structure, when the impedance between two points on the wiring is proportional to the distance between the two points, errors in the layout can be checked for without calculating the impedance, by comparing the shortest wiring distance between the power pin and the power source with the shortest wiring distance between the power pin and the bypass capacitor.

Furthermore, when a power via exists on wiring that connects the power pin and the bypass capacitor, the calculation unit may calculate, with use of the layout data, a shortest wiring distance between the power pin and the power via as the first value, and the shortest wiring distance between the power pin and the bypass capacitor as the second value.

According to the stated structure, when the power via is connected to a power plane and the impedance of the power plane is considered to be 0, errors in the layout can be checked for without calculating the impedance, by comparing the shortest wiring distance between the power pin and the power via with the shortest wiring distance between the power pin and the bypass capacitor.

Furthermore, the storage unit may store a threshold value, and the judgment unit may judge whether the layout allows the bypass capacitor to function effectively, by comparing the threshold value with a value that represents a ratio of the first value to the second value.

Furthermore, the layout data may include type information that indicates whether wiring is a line or a plane, and, for wiring that is a plane, further includes area information indicating a surface area of the plane, the storage unit may store a prescribed value, the layout check system may further include: an analysis unit operable to analyze, with use of the type information, whether wiring that connects the power pin and the bypass capacitor is a line or a plane; and a power plane judgment unit operable to judge, when a result of the analysis indicates that the wiring that connects the power pin and the bypass capacitor is a plane, whether the surface area of the plane is less than the prescribed value, by referring to the area information, and when the surface area is less than the prescribed value, judge that the plane is a specific power plane, and when the power plane judgment unit judges the wiring to be the specific power plane, the analysis unit may further analyze, with use of the layout data, whether the specific power plane and the power source are connected without a bypass capacitor therebetween, and when a result of the analysis indicates that the specific power plane and the power source are connected without a bypass capacitor therebetween, judge that the layout is not a layout that allows a bypass-capacitor to function effectively.

According to the stated structure, a check can be performed to determine whether the layout is one in which parasite noise from the power pin connected to the specific power plane is prevented from leaking from the specific power plane.

Furthermore, the present invention is a layout check method for checking layout data that defines a layout of a power source, a component that includes a power pin, and a bypass capacitor on a printed wiring board, including: an obtaining step of obtaining layout data, the layout data including information used for calculating a first value and a second value, the first value corresponding to impedance between the power pin and the power source, and the second value corresponding to impedance between the power pin and the bypass capacitor; a calculation step of calculating the first value and the second value, with use of the layout data; a judgment step of judging, by comparing the first value with the second value, whether the layout allows the bypass capacitor to function effectively; and an output step of outputting error information when a result of the judgment is negative.

Furthermore, the present invention is a program that has a computer execute layout check processing for checking layout data that defines a layout of a power source, a component that includes a power pin, and a bypass capacitor on a printed wiring board, including: an obtaining step of obtaining layout data, the layout data including information used for calculating a first value and a second value, the first value corresponding to impedance between the power pin and the power source, and the second value corresponding to impedance between the power pin and the bypass capacitor; a calculation step of calculating the first value and the second value, with use of the layout data; a judgment step of judging, by comparing the first value with the second value, whether the layout allows the bypass capacitor to function effectively; and an output step of outputting error information when a result of the judgment is negative.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings:

FIG. 9 shows an example of retrieved bypass capacitor list information;

FIG. 10 shows an example of wiring information;

DESCRIPTION OF THE PREFERRED EMBODIMENT

The following describes embodiments of the present invention with use of the drawings. Note that the described embodiments are simply specific examples of the present invention and do not limit the technical range of the present invention.

First Embodiment

Overview

The layout check system of the first embodiment is a CAD system used for PCB layout design. A layout designer creates layout data using the system.

The layout check system of the present embodiment has the following features. In order to check-whether a PCB layout defined by created layout data will enable the bypass capacitors positioned on the PCB to function effectively, the layout check system first calculates a value Z1 that corresponds to the impedance between a power pin of a high-speed IC on the PCB and the power source, and a value Z2 that corresponds to the impedance between the power pin and a bypass capacitor. The layout check system then compares the calculate values, and when Z1 is less than Z2, judges that an error exists, and outputs error information.

Structure

Figure 1:
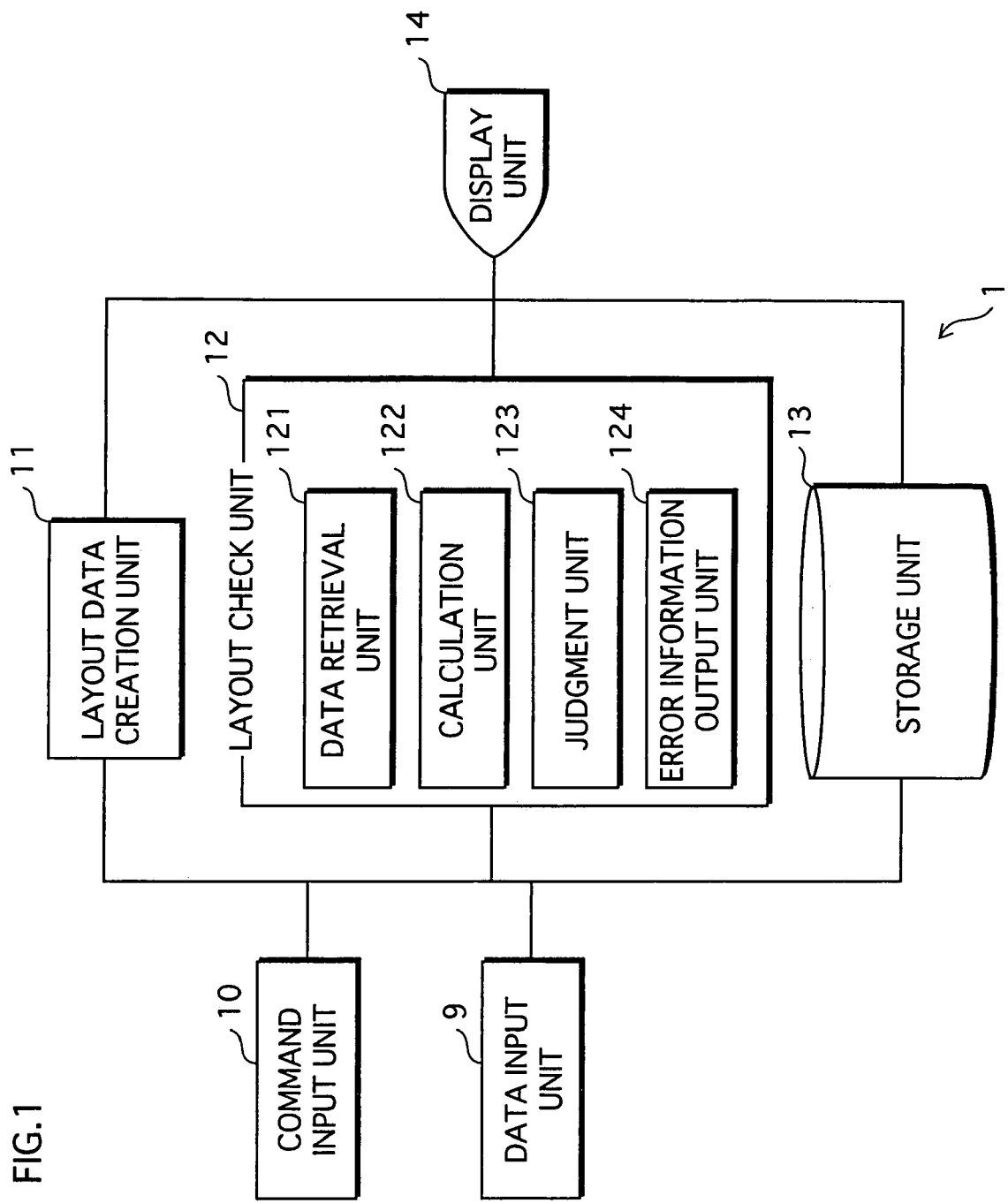
FIG. 1 shows the functional structure of a layout check system of a first embodiment.

FIG. 1 shows the functional structure of the layout check system of the first embodiment.

The layout check system 1 is composed of functional units including a data input unit 9, a command input unit 10, a layout data creation unit 11, a layout check unit 12, a storage unit 13, and a display unit 14. Note that functions that are not necessary to describe the features of the present invention are omitted from the description.

The layout check system 1 is a computer whose hardware includes a CPU, an input device, an output device, and a storage device, and achieves its functions according to the CPU executing a program stored in the storage device.

The data input unit 9 receives an input of data of a circuit diagram created using a circuit diagram design CAD or the like. The received circuit diagram data is stored in the storage unit 13.

The command input unit 10 receives a command input by the user with use of the input device, which is a keyboard, a mouse, or the like. Types of commands may include an activate command to activate a CAD application program, a draw command to determine a component position of a wiring pattern on a PCB layout drawing, and a layout check command to check a created layout.

The layout data creation unit 11 functions according to the command input unit 10 receiving an input of an activate command from the user and the CAD application program activating. The layout data creation unit 11 creates layout data based on input circuit drawing data and draw commands received by the command input unit 10 from the user. The created layout-data is stored in the storage unit 13.

The layout data includes PCB information, component information, terminal information, net information, wiring information, and design rule information.

PCB information includes information about the structure of the layers of the PCB, the dimensions of the PCB, and the electrical characteristics of the material from which the PCB is composed.

Component information includes component numbers that identify each component mounted on the PCB, component shape information that identifies the shape of each component, component type information that identifies the type of each component, component reference coordinates that show the position of each component, and information about the electrical characteristics of each component.

Terminal information includes the component number of the component to which each terminal belongs, terminal numbers that identifies each terminal, and terminal coordinates that show the position of each terminal.

Net information includes net names identifying connection relationships between the terminals of the components, and connection terminal numbers.

Wiring information includes information identifying whether each wiring is a plane or a line, via coordinates, wiring width, and wiring thickness. In addition, for wiring that is a line, the wiring information includes coordinates of the starting and ending points of the line, and information about the wiring layers. For wiring that is a plane, the wiring information includes the number of structural points, structural point coordinates, and printing area characteristics.

Design rule information includes information about the thickness of the dielectric, relative permittivity of the dielectric, conductive foil thickness, and clearance value.

The layout check unit 12 functions according to the command input unit 10 receiving a layout check command while the CAD application program is being executed, and executes layout check processing for checking whether the layout of a PCB defined by the layout data created in the layout data creation unit 11 will allow the bypass capacitors on the PCB to function effectively.

The layout check unit 12 includes a data retrieval unit 121, a calculation unit 122, a judgment unit 123, and an error information output unit 124 that realize the layout check processing.

The data retrieval unit 121 retrieves, from among the layout data stored in the storage unit 13, information necessary for the check, and specifies a combination of a power pin and a bypass capacitor that are connected to the same source pattern. Details of the information used here are described later.

The calculation unit 122 calculates the value Z1 that corresponds to the impedance between a power pin of the high-speed IC and the power source, and the value Z2 that corresponds to the impedance between the power pin and a bypass capacitor. These values are described later.

The judgment unit 123 compares the calculated Z1 and Z2, and if Z1 is smaller than Z2, judges that an error exists.

After all power pins and bypass capacitors in the list information have been checked, and if an error is judged in any of the combinations of power pins and bypass capacitors, the error information output unit 124 outputs error information indicating that the checked layout does not allow the bypass capacitors to function effectively. The output error information is displayed by the display unit 14.

The storage unit 13 is a storage device such as a memory or a hard disk, and stores input circuit diagram data, created layout data, an OS (operating system), the CAD application program, and so on.

The display unit 14 is a display device, and displays various types of information such as a created PCB layout diagram, and error information output by the error information output unit 124.

PCB Layout Example

Figure 2:
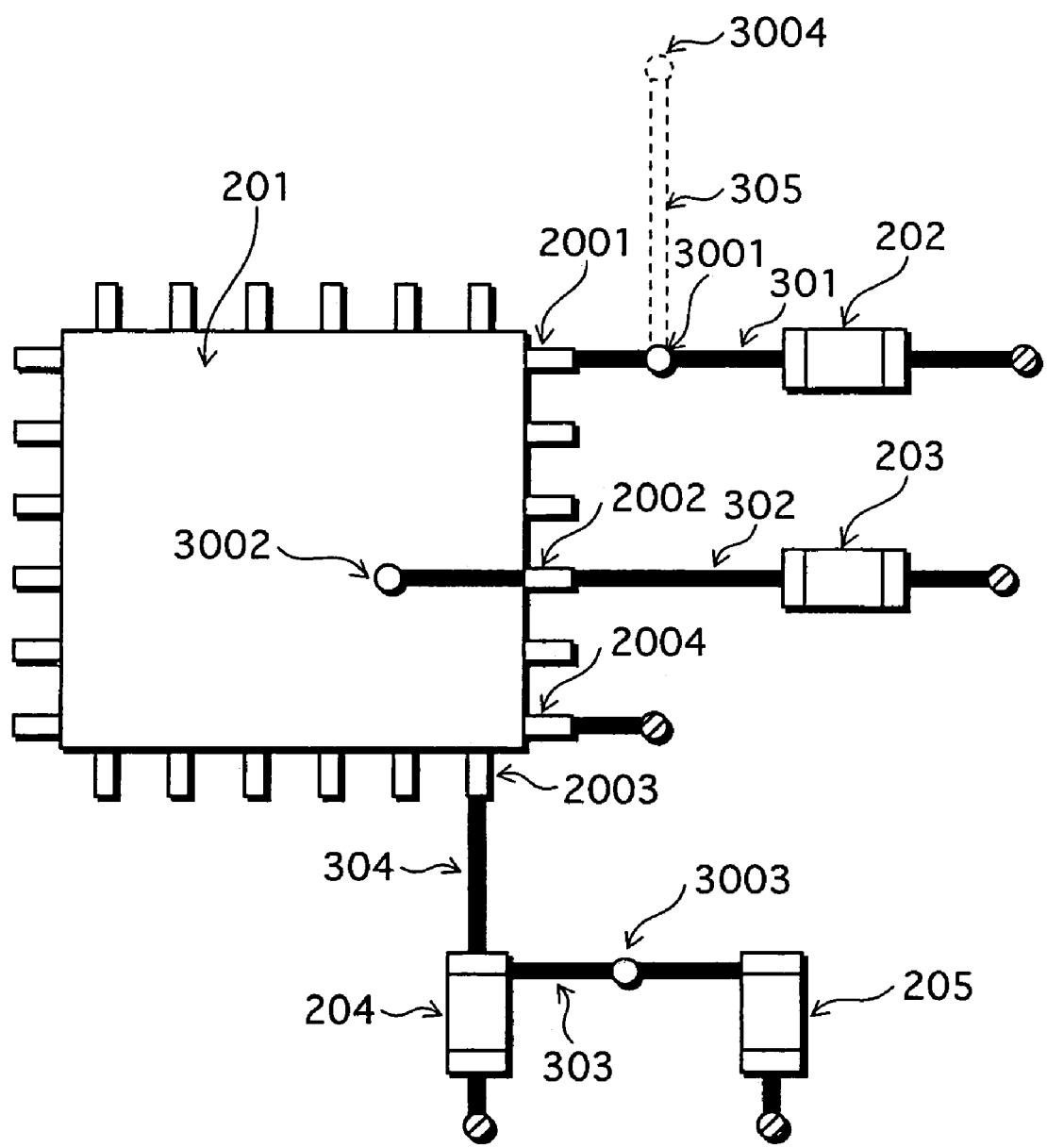
FIG. 2 shows an example of a PCB layout subject to a layout check.

FIG. 2 shows an example of a PCB layout that is subject to a layout check in layout check processing.

In the PCB layout shown in the drawing, a high-speed IC 201, a bypass capacitor 202, a bypass capacitor 203, a bypass capacitor 204, and a bypass capacitor 205 are arranged on the top layer and, although not illustrated, a power plane and a ground plane are positioned on lower layers.

In FIG. 2 the thick lines express power patterns, unfilled circles express power vias connected to a power plane or a power pattern on a lower layer, circles with diagonal lines therein express ground vias that are connected to a ground plane on a lower layer, and dotted lines express a power pattern 305 and a power via 3004 provided on a lower layer.

The high-speed IC 201 includes a power pin 2001, a power pin 2002, a power pin 2003, a ground pin 2004, and other terminals.

A power via 3001 provided in a power pattern 301 is connected to a power pattern 305 provided on a lower layer.

A power via 3002 provided in a power pattern 302, a power via 3003 provided in a power pattern 303, and a power via 3004 provided in a power pattern 304 are connected to a power plane provided on another layer.

Note that the power via 3002 and part of the power pattern 302 are seen through the high-speed IC 201, and control signal wiring patterns are omitted. Furthermore, all power patterns are identical in width and thickness.

Figure 3:
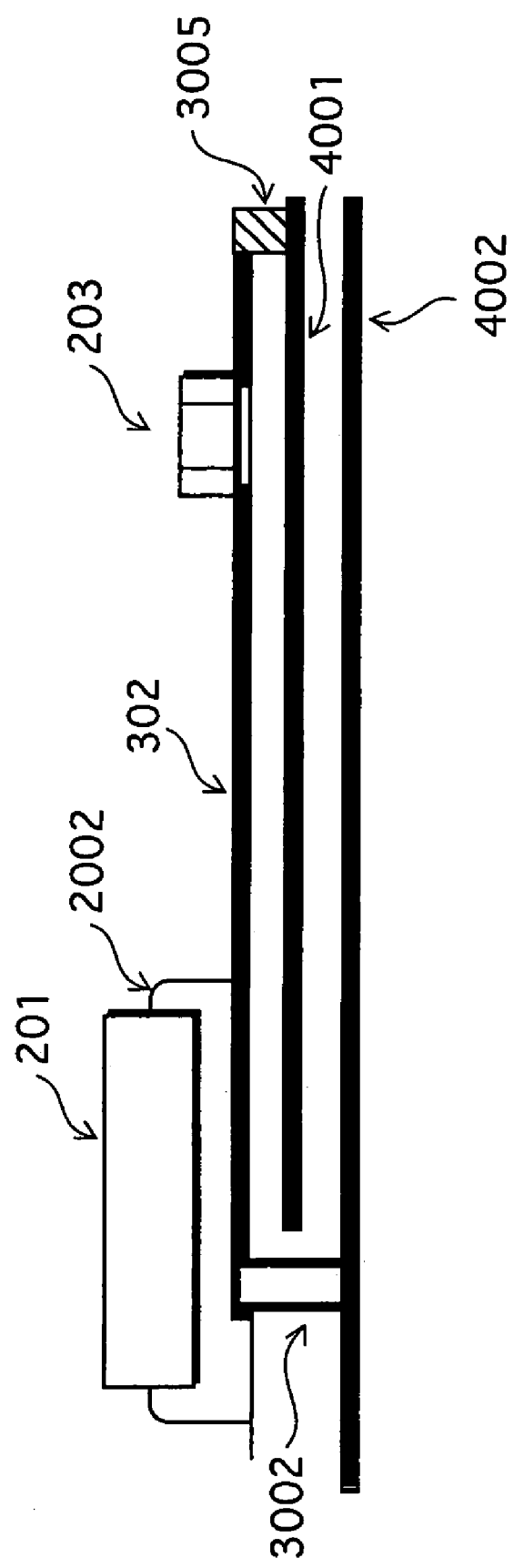
FIG. 3 shows schematically a cross-section of the PCB of the PCB layout shown in FIG. 2, cut at a source pattern 302.

FIG. 3 shows schematically a cross-section of the PCB of the PCB layout shown in FIG. 2, cut at the power pattern 302. The drawing shows the ground via 3005 connected to a ground plane 4001, and the power via 3002 connected to a power plane 4002.

Figure 4:
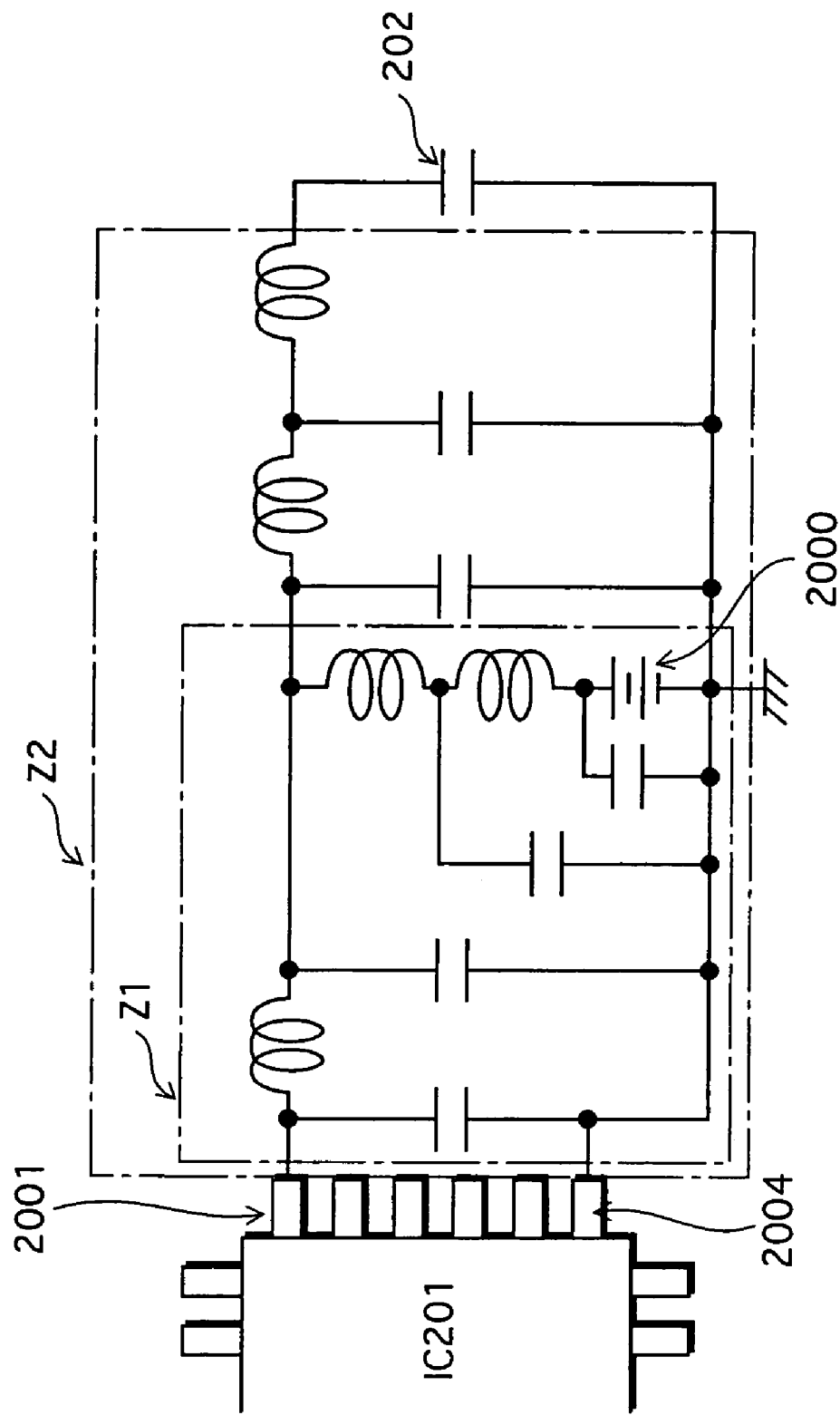
FIG. 4 shows an example of an equivalent circuit of an impedance value Z1 and an impedance value Z2.

FIG. 4 is an example of a equivalency circuit model of Z1 which is the impedance value between the power pin 2001 and the power source 2000, and Z2 which is the impedance value between the power pin 2001 and the bypass capacitor 202.

Z1 and Z2 can be found from the capacitance c[F/m] and inductance l[H/m] per unit of length of power pattern, the distance between the power pin and the power source, and the distance between the power pin and the bypass capacitor.

Here, the method of calculating the characteristic impedance power patterns of a microstrip line structure and a strip line structure is described.

In the case of a microstrip line, structure, the capacitance c[F/m] and the inductance l[H/m] per unit of length of the power pattern, and the characteristic impedance Z[Ω] of the power pattern can be found using information such as the power pattern width (w), the dielectric layer thickness (h), and the dielectric relative permittivity ($\in_r$), and the following expressions.

$$c = \sqrt{\in_{re}}/(v_0 * z)$$

$$l = c * z^2$$

$$d = w/h \qquad \text{Expression 1}$$

When d<1:

$$f = 1/\sqrt{1+12/d} + 0.04*(1-d)^2$$

$$\in_{re} = ((\in_r + 1) + (\in_r - 1)*f)/2$$

$$z = (60 * \ln(8/d + d/4))/\sqrt{\in_{re}} \qquad \text{Expression 2}$$

When d≧1:

$$f = 1/\sqrt{1+12/d}$$

$$\in_{re} = ((\in_r + 1) + (\in_r - 1)*f)/2$$

$$z = 120\pi/((d + 1.393 + 0.667 * \ln(d + 1.444)) * \sqrt{\in_{re}}) \qquad \text{Expression 3}$$

Vo is the velocity of light.

Furthermore, in the case of a strip line structure, the capacitance c[F/m] and the inductance l[H/m] per unit of length of the power pattern, and the characteristic impedance Z[Ω] of the power pattern can be found using information such as the power pattern width (w), the power pattern thickness (H), and the dielectric relative permittivity ($\in_r$), and the following expressions.

$$c = \sqrt{\in_{re}}/(v_0 * z)$$

$$l = c * z^2 \qquad \text{Expression 4}$$

$$f = 1/\sqrt{1 - 10/d}$$

$$\in_{re} = ((\in_r + 1) + (\in_r - l)*f)/2$$

$$z = (60 * \ln(1.9H/(0.8w + t)))/\sqrt{\in_{re}} \qquad \text{Expression 5}$$

Vo is the velocity of light.

Operations

The following describes layout check processing performed by the layout check unit 12.

Figure 5:
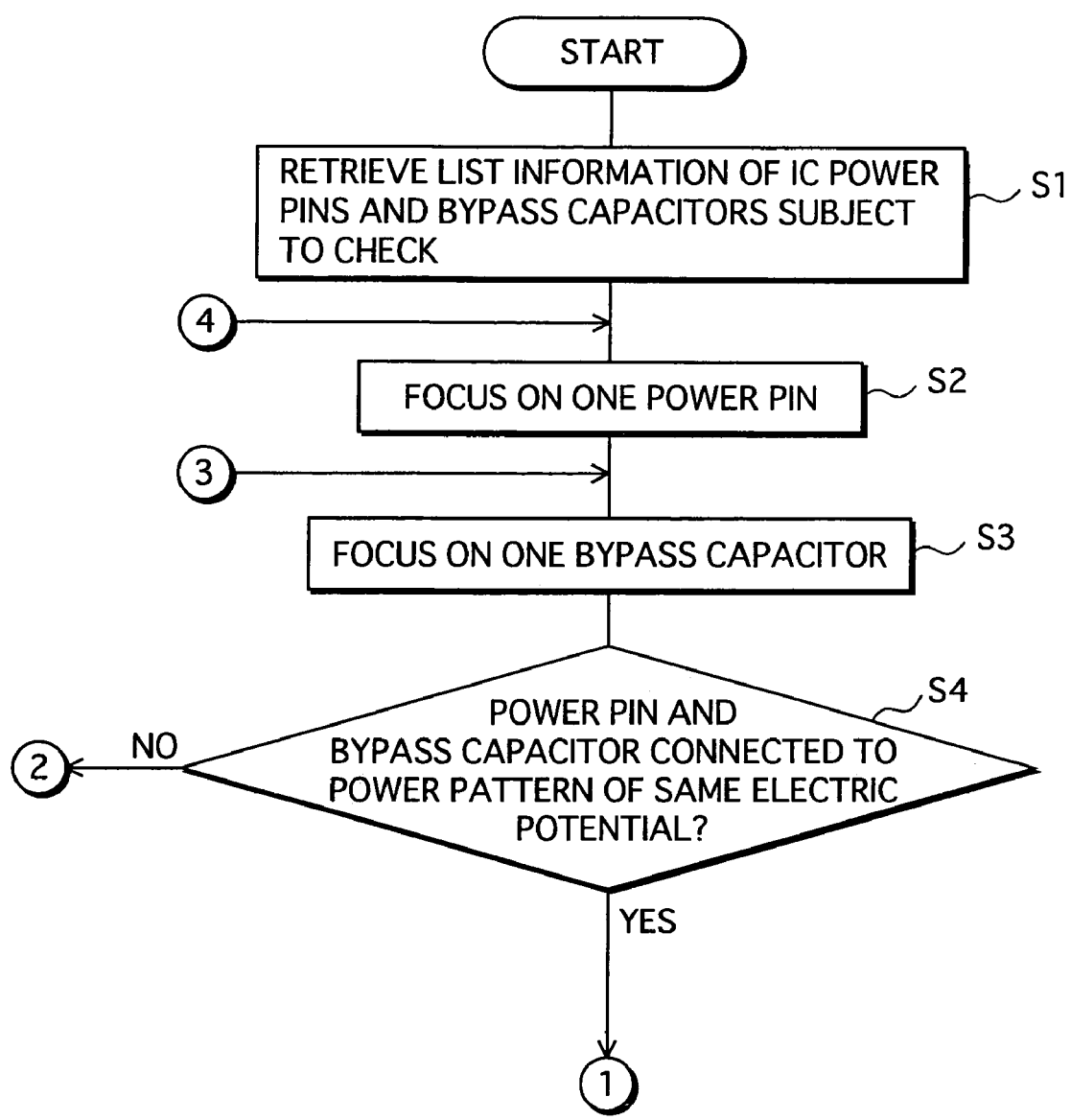
FIG. 5 is a flowchart for describing layout check processing of the first embodiment.
Figure 6:
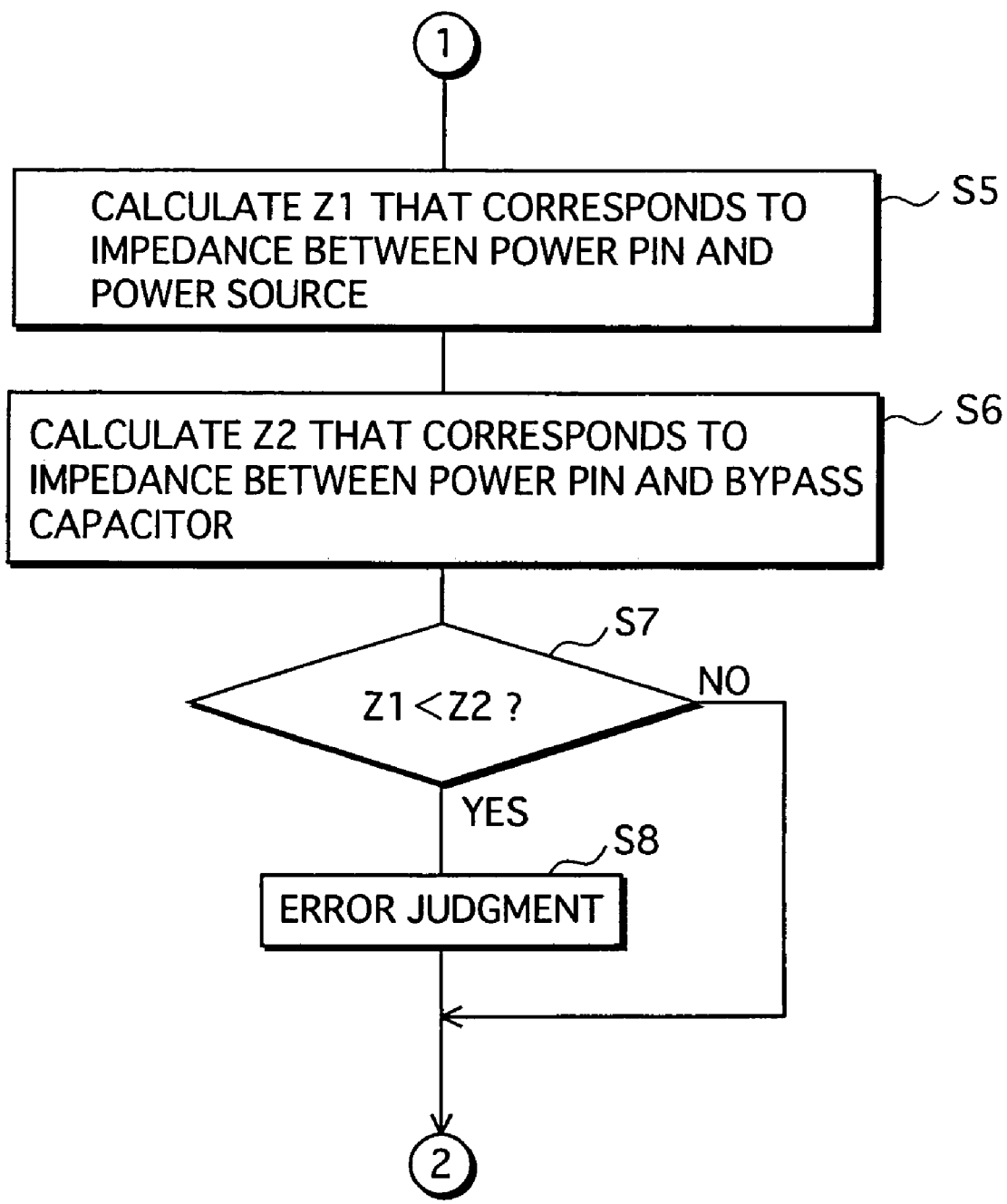
FIG. 6 is a flowchart for describing layout check processing of the first embodiment.
Figure 7:
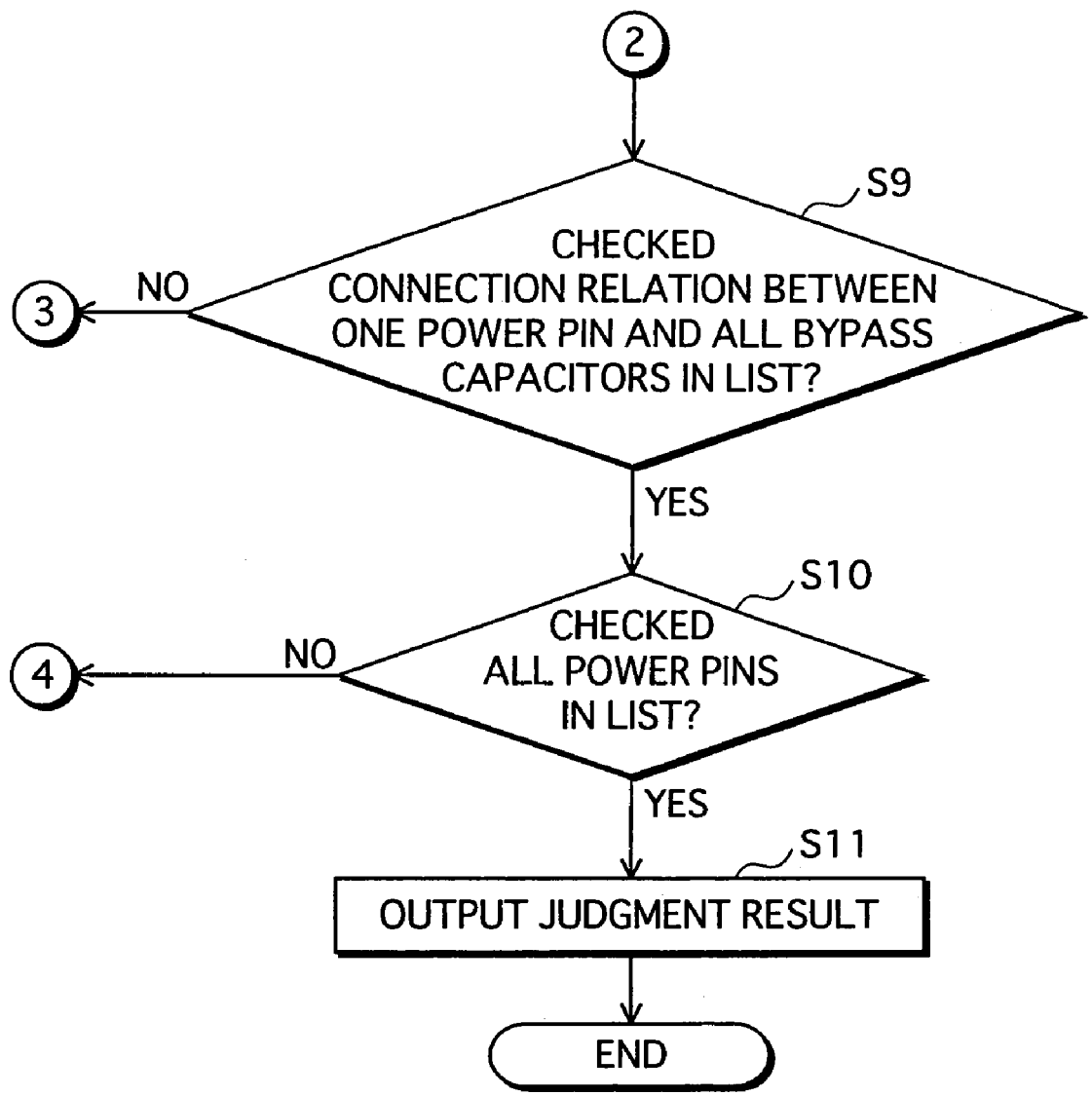
FIG. 7 is a flowchart for describing layout check processing of the first embodiment.

FIGS. 5 to 7 are flowcharts for describing the layout check processing of the first embodiment.

First, at step S1, the data retrieval unit 121 retrieves from the storage unit 13 (i) power pin list information for the power pin being checked, the power pin list information including the pin number, the terminal coordinates, and the connection wiring net name, (ii) bypass capacitor list information for the bypass capacitor being checked, the bypass capacitor list information including the component number of the bypass capacitor, the component coordinates, and the connection wiring net name, and (iii) wiring information including a net name identifying the wiring, wiring type information identifying whether the wiring is a line or a plane, via coordinates indicating the position of a via provided in the wiring, wiring width information indicating the width of the wiring, starting point coordinates indicating the starting point of the wiring, ending point coordinates indicating the ending point of the wiring, and a wiring layer number indicating the layer of the board on which the wiring is provided.

Note that when calculating the impedance values as Z1 and Z2, it is necessary to calculate the characteristic impedance of the power pattern, and therefore it is necessary for the data retrieval unit 121 to retrieve information indicating the wiring structure, information such as the dielectric thickness (h) and the dielectric permittivity ($\in_r$) if the power pattern in a microstrip line structure, and, in addition, if the power pattern is a stripe line structure, the power pattern thickness (t).

Furthermore, the data retrieval unit 121 retrieves, from among the numerous capacitors on the PCB, information about the bypass capacitors that are connected to the power pattern and the ground pattern (a wiring pattern connected to ground).

Next, the data retrieval unit 121 focuses on one power pin (hereinafter referred to as the "focus power pin") in the retrieved power pin list information (step S2), focuses on one bypass capacitor (hereinafter referred to as the "focus bypass capacitor") in the retrieved bypass capacitor list information (step S3), and judges whether the focus power pin and the focus bypass capacitor are connected to the same power pattern (step S4). This is judged based on whether or not the net names are the same.

If the result of the judgment is positive (step S4: YES), the processing proceeds to step S5, and if the result of the judgment is negative (step S4: NO), the processing proceeds to step S9.

At step S5 the calculation unit 122 calculates the value Z1 that corresponds to the impedance between the power pin and the power source, and at step S6 the calculation unit 122 calculates the value V2 that corresponds to the impedance between the power pin and the bypass capacitor. Note that since the impedance of the power plane is extremely low, when a power plane exists between the power pin and the power source, the calculation unit 122 calculates a value that corresponds to the impedance between the power pin and the power pattern from the power pin to the power plane as Z1.

The judgment unit 123 compares Z1 and Z2 calculated by the calculation unit 122 (step S7), and if Z1 is less than Z2 (step S7: YES), judges that an error exists (step S8), and the processing proceeds to step S9.

If Z1 is greater than Z2 (step S7: NO), the processing proceeds to step S9.

When connection relationship between the focus power pin and all the bypass capacitors in the retrieved bypass capacitor list information has been checked (step S9: YES), the processing proceeds to step S10. If all have not been checked (step S9: NO), the processing returns to step S3, and another bypass capacitor is focused on.

At step S10, when all the power pins in the retrieved power pin list information have been checked (step S10: YES), the processing proceeds to step S11. When all have not been checked (step S10: NO), the processing returns to step S2 and focuses on another power pin.

At step S8, when one or more errors have been judged to exist, the error information output unit 124 outputs error information indicating that the checked layout does not allow the bypass capacitors to function effectively (step S11), and the layout check processing ends.

Specific Example of Layout Check Processing

The following describes a specific example of the layout check processing applied to the PCB layout shown in FIG. 2.

As described earlier, since all power patterns in the PCB layout shown in FIG. 2 are identical in width and thickness, the impedance between two points of the power pattern is proportional to the distance.

When checking this kind of PCB layout, the layout check unit 12 calculates the shortest wiring distance between the power pin and the power source as the value Z1 that corresponds to the impedance between the power pin and the power source, and calculates the shortest distance between the power pin and the bypass capacitor as the value Z2 that corresponds to the impedance between the power pin and the bypass capacitor. Furthermore, the layout check unit 12 compares these two values to determined whether an error exists in the layout.

Note that since the impedance of a power plane is very low, when a power plane exists between the power pin and the power source, the distance from the power pin to the power pattern that connects to the power plane is calculated as the shortest wiring distance between the power pin and the power source.

The following describes the various types of information retrieved by the data retrieval unit 121.

Figure 8:
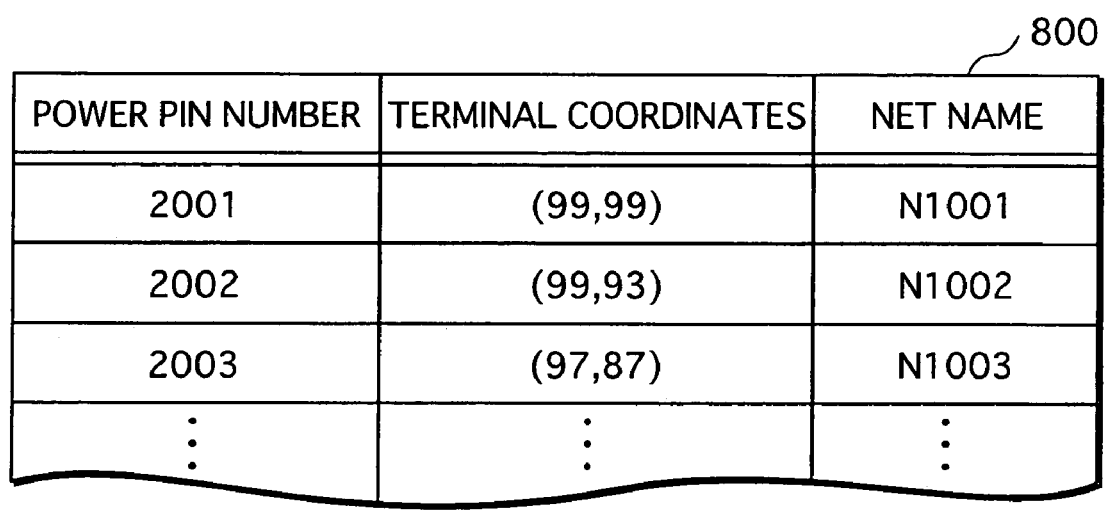
FIG. 8 shows and example of retrieved power pin list information.

FIG. 8 shows an example of the power pin list information retrieved by the data retrieval unit 121.

The list information 800 shown in FIG. 8 includes power pin numbers and power pin coordinates of the power pins whose information has been retrieved, and net names identifying the wiring to which the power pins are connected.

FIG. 9 shows an example of the bypass capacitor list information retrieved by the data retrieval unit 121.

The list information 900 shown in FIG. 9 includes component numbers of the bypass capacitors whose information has been retrieved, the coordinates of the bypass capacitors, and the net names of the wiring to which the bypass capacitors are connected.

FIG. 10 shows an example of the wiring information retrieved by the data retrieval unit 121.

The wiring information 1000 shown in FIG. 10 includes wiring identifiers identifying each wiring, net names identifying each net, wiring type information identifying whether each wiring is a line or a plane, via coordinates indicating the position of vias provided in the wiring, wiring width information indicating the width of each wiring, starting point coordinates indicating the starting point of each wiring, ending point coordinates indicating the ending point of each wiring, and wiring layer numbers indicating the layer in the board on which each wiring is provided.

The data retrieval unit 121 retrieves the various types of information shown FIGS. 8 to 10 from the storage unit 13, focuses on one power pin included in the list information 800 and one bypass capacitor included in the list information 900, and checks whether the power patterns to which these are connected have the same name.

The following describes examples of calculation of Z1 and Z2 performed for combinations (combinations (1) to (4)) of a power pin and a bypass capacitor connected to a power pattern having the same net name, and judging by comparing the calculated Z1 and Z2.

(1) Power Pin 2001 and Bypass Capacitor 202 Connected to Power Pattern 301

The calculation unit 122 calculates the shortest wiring distance L1 between the power pin 2001 and the power source, and the shortest wiring distance L2 between the power pin 2001 and the bypass capacitor 202, based on the coordinate information.

L1 is the total of a wiring distance l between the power pin 2001 and the power via 3001 on the power pattern 301 plus a distance m between the power via 3001 and the power via 3004 on the power pattern 305.

Based on the terminal coordinates (99, 99) of the power pin 2001 and the via coordinates (101, 99) of the power via 3001, the value of l is l=101−99=2.

Furthermore, based on the via coordinates (101, 99) of the power via 3001 and the via coordinates (101, 107) of the power via 3004, the value of m is m=107−99=8.

Accordingly, L1=l+m=2+8=10.

Furthermore, based on the terminal coordinates (99, 99) of the power pin 2001 and the component coordinates (105, 99) of the bypass capacitor 202, the value of L2 is L2=105−99=6.

The judgment unit 123 compares the values of Z1 and Z2, according to L1=Z1=10 and L2=Z2=6, and since Z1 is greater than Z2, and judges that no error exists.

(2) Power Pin 2002 and Bypass Capacitor 203 Connected to Power Pattern 302

The calculation unit 122 calculates the shortest wiring distance L3 between the power pin 2002 and the power via 3002, and the shortest wiring distance L4 between the power pin 2002 and the bypass capacitor 203, based on the coordinate information.

Based on the terminal coordinates (99, 93) of the power pin 2002 and the via coordinates (95, 93) of the power via 3002, the value L3 is L3=99−95=4.

Based on the terminal coordinates (99, 93) of the power pin 2002 and the component coordinates (105, 93) of the bypass capacitor 203, the value of L4 is L4=105−99=6.

The judgment unit 123 compares the values of Z1 and Z2, according to L3=Z1=4 and L4=Z2=6, and since Z1 is less than Z2, judges that an error exists.

(3) Power Pin 2003 and Bypass Capacitor 204 Connected to Power Pattern 303 and Power Pattern 304

The calculation unit 122 calculates the shortest wiring distance L5 between the power pin 2003 and the power via 3003, and the shortest wiring distance L6 between the power pin 2003 and the bypass capacitor 204, based on the coordinate information L5 is the total of a wiring distance h from the starting point to the ending point of the power pattern 304 and a wiring distance i from the starting point of the power pattern 303 to the power via 3003.

Based on the starting point coordinates (97, 87) and the ending point coordinates (97, 81) of the power pattern 304, the value of h is h=87−81=6.

Based on the starting point coordinates (97, 81) of the power pattern 303 and the via coordinates (100, 81) of the power via 3003, the value of i is i=100−97=3.

Accordingly, L5=h+i=6+3=9.

Based on the terminal coordinates (97, 87) of the power pin 2003 and the component coordinates (97, 80) of the bypass capacitor 204, the value L6 is L6=87−80=7.

The judgment unit 123 compares the values of Z1 and Z2, according to L5=Z1=9 and L6=Z2=7, and since Z1 is greater than Z2, and judges that no error exists.

(4) Power Pin 2003 and Bypass Capacitor 205 Connected to Power Pattern 303 and Power Pattern 304

The calculation unit 122 calculates the shortest wiring distance L5 between the power pin 2003 and the power via 3003, and the shortest wiring distance L7 between the power pin 2003 and the bypass capacitor 205, based on the coordinate information.

The value of L5 is 9, calculated as described above.

The value L7 is the total of the wiring distance h from the starting point to the ending point of the power pattern 304 and a wiring distance j from the starting point to the ending point of the power pattern 303.

The value of h is 6, calculated as described above.

Based on the starting point coordinates (97, 81) and the ending point coordinates (103, 81) of the power pattern 303, the value of j is j=103−97=6.

Accordingly, L7=h+j=6+6=12.

The judgment unit 123 compares the values of Z1 and Z2, according to L5=Z1=9 and L7=Z2=12, and since Z1 is less than Z2, judges that an error exists.

Modifications

Instead of comparing the size of the value Z1 that corresponds to the impedance between the power pin and the power source and the value Z2 that corresponds to the impedance between the power pin and the bypass capacitor, the judgment unit 123 of the layout check system 1 may judge the layout by comparing a value of the ratio of Z1 to Z2, specifically Z1/Z2, to a threshold value.

Figure 11:
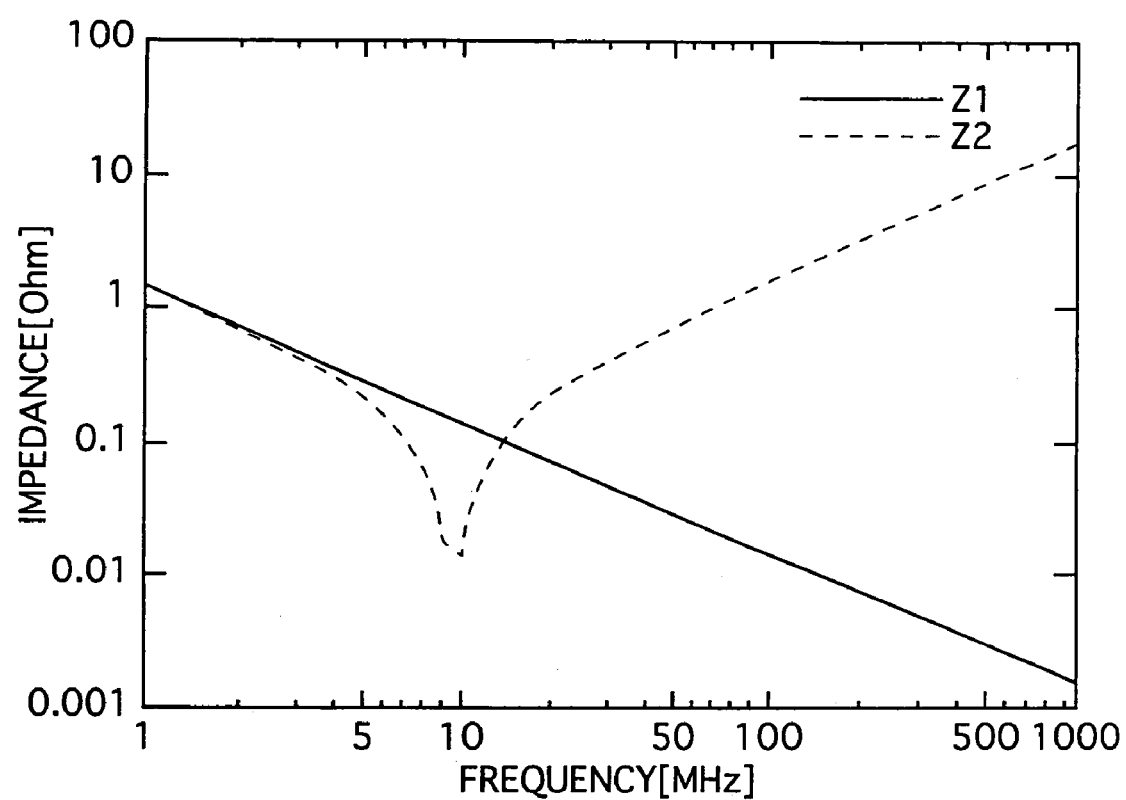
FIG. 11 shows an example of a graph of impedance value Z1 and impedance value Z2 that vary according to frequency.

FIG. 11 shows an example of the impedance value Z1 between the power pin and the power source and the impedance value Z2 between the power pin and the bypass capacitor that vary according to the frequency.

The impedance of the power pattern and the bypass capacitor vary according to the frequency. As shown in FIG. 11, the relationship between the sizes of Z1 and Z2 reverses at around 13 MHZ, and Z1 is less than one tenth of Z2 at 32 MHz and above.

Figure 12:
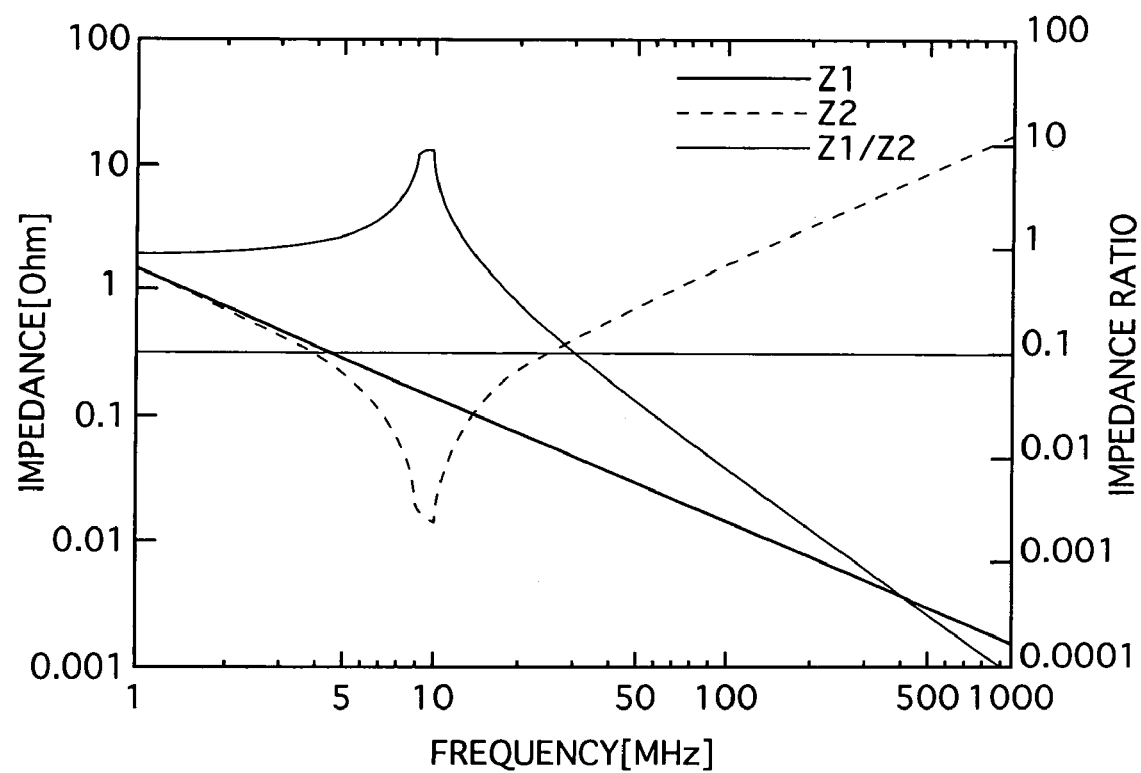
FIG. 12 is the graph in FIG. 11 with the addition of the value of Z1/Z2.

FIG. 12 shows the graph of FIG. 11 with the addition of lines representing the value of Z1/Z2 and the threshold value.

In a specification that stipulates that an error is judged to exist when the value of Z1/Z2 is less than 0.1, if the frequency is 32 MHZ or higher, the judgment unit 132 judges an error to have occurred since the value of Z1/Z2 is less than 0.1.

Furthermore, the judgment may be performed taking into consideration the n-th harmonic component (n being a positive integer) of the basic frequency. In this case harmonic components up to at least the fifth should be taken into consideration. If the basic frequency is 10 MHz, the fifth harmonic component is 50 MHZ, and since Z1/Z2<0.1 at 50 MHz, the judgment unit 123 judges that an error exists in the checked layout.

Second Embodiment

Overview

The layout check system of the second embodiment is identical to the layout check system 1 described in the first embodiment except for additional functions in the layout check unit 12.

The additional functions are a function of judging whether a power pattern to which a power pin of a high-speed IC is connected is a power plane called a "power island", and a function of analyzing whether wiring exists between the power island and the main power plane (a plane that is directly connected to the power source) that is connected without a bypass capacitor.

A conventional check system does not check whether a PCB layout having a power island is a layout that allows a bypass capacitor positioned near the power island to control parasitic noise from the high-speed IC connected to the power island to function effectively.

The layout check system of the second embodiment is characterized in performing the following error judgments using the additional functions.

1. The layout check system judges an error to exist when the power pattern to which the power pin of a high-speed IC is connected is the main power plane.

2. When the power pattern to which the power pin of a high-speed IC is connected is a power island, the layout check system analyzes whether wiring exists between the power island and the main power plane that is connected without a bypass capacitor, and if such wiring exists, judges that an error exists.

Structure

Since only the layout check unit in the layout check system of the second embodiment differs from that of the first embodiment, the following describes only the layout check unit.

Figure 13:
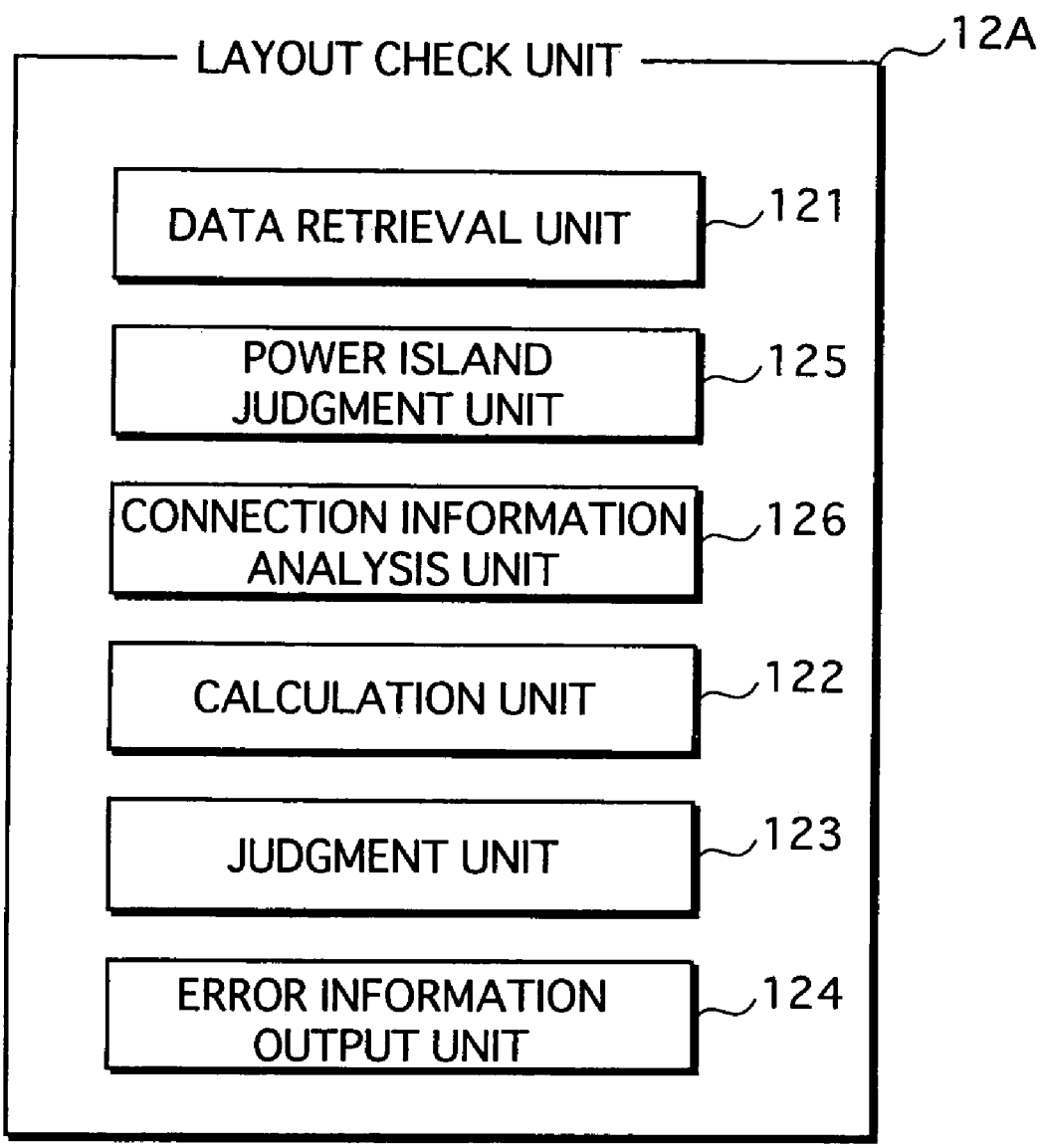
FIG. 13 shows the functional structure of a layout check unit of a second-embodiment.

FIG. 13 shows the functional structure of the layout check unit of the second embodiment.

In addition to the data retrieval unit 121, the calculation unit 122, the judgment unit 123, and the error information output unit 124, the layout check unit 12A includes a power island judgment unit 125 and a connection information analysis unit 126.

The connection information analysis unit 126 analyzes whether the power pattern to which the power pin being focused on by the data retrieval unit 121 is a plane. The connection information analysis unit 126 refers to the wiring information for this analysis.

When the power pattern to which the focus power pin is connected is judged to be a power island by the power island judgment unit 125, the connection information analysis unit 126 refers to the wiring information to analyze whether wiring exists between the power island and the main power plane that is connected without a bypass capacitor. If such wiring is shown to exist as a result of the analysis, the connection information judgment unit 126 judges that an error exists.

When the connection information analysis unit 126 judges that the power pattern to which the focus power pin is connected is a plane, in other words a power plane, the power island judgment unit 125 checks whether the surface area of the power plane is less than a threshold value.

If the surface area is less than the threshold value, the power island judgment unit 125 judges that the power plane is a power island, and if the surface area is greater than the threshold value, judges that the power plane is a main power plane. When the power pattern to which the focus power pin is connected is a main power plane, an error is judged to exist.

Example of a PCB Layout

Figure 14:
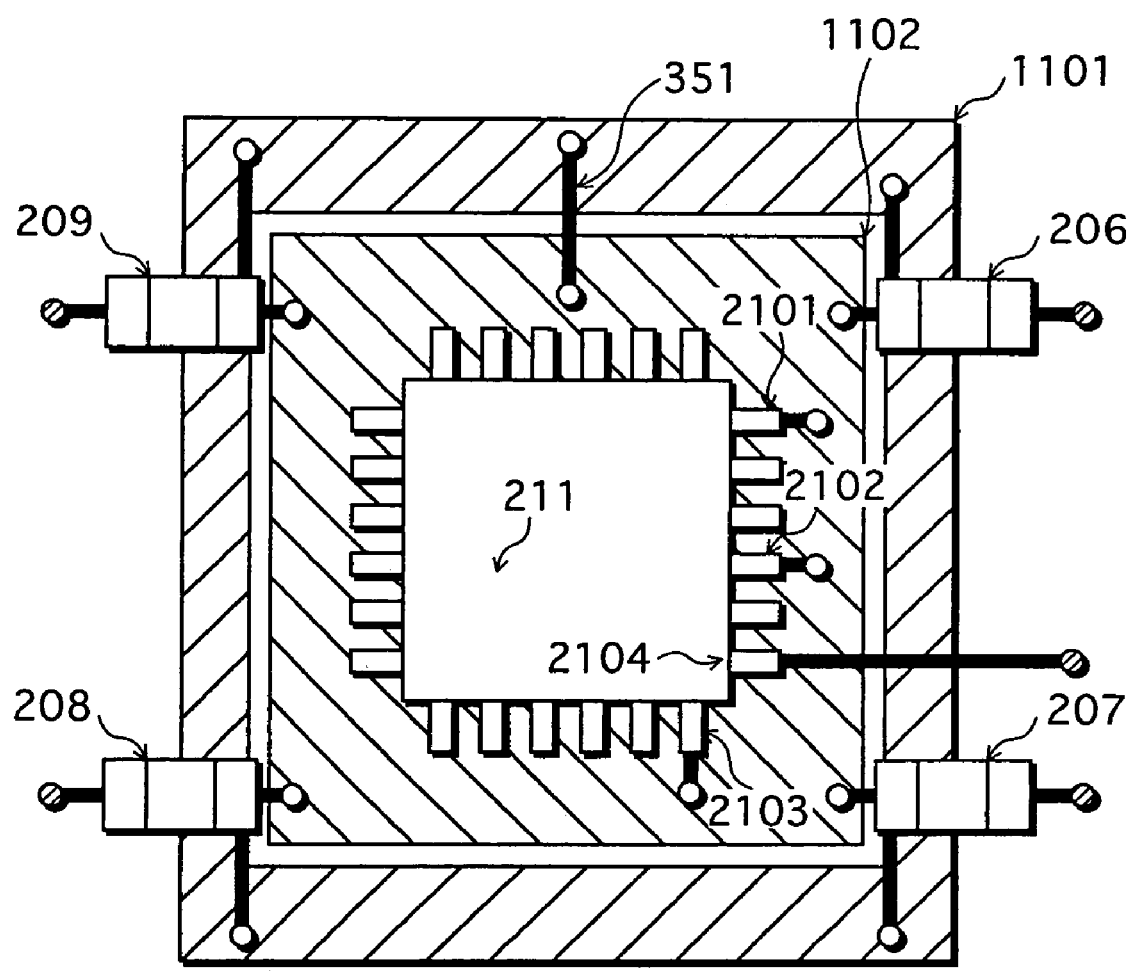
FIG. 14 shows an example of a PCB layout subject to a layout check.

FIG. 14 shows an example of a PCB layout that has a power island and that is subject to a layout check in layout check processing.

In the PCB layout of FIG. 14, a high-speed IC 211, a bypass capacitor 206, a bypass capacitor 207, a bypass capacitor 208, and a bypass capacitor 209 are arranged on a top layer, and a main power plane 1101, a power island 1102, and a ground plane (not illustrated) are arranged on a lower layer.

In FIG. 14 each thick line expresses a power pattern, each unfilled circle expresses a power via that connects to a power plane of another layer, and each circle with diagonal lines therein expresses a ground via that connects to a ground plane on another layer.

The high-speed IC 211 has a power pin 2101, a power pin 2102, a power pin 2103, and ground pin 2104, and other terminals.

Note that wiring patterns for control signals are omitted from the drawing.

Operations

The following describes layout check processing performed by the layout check unit 12A.

Figure 15:
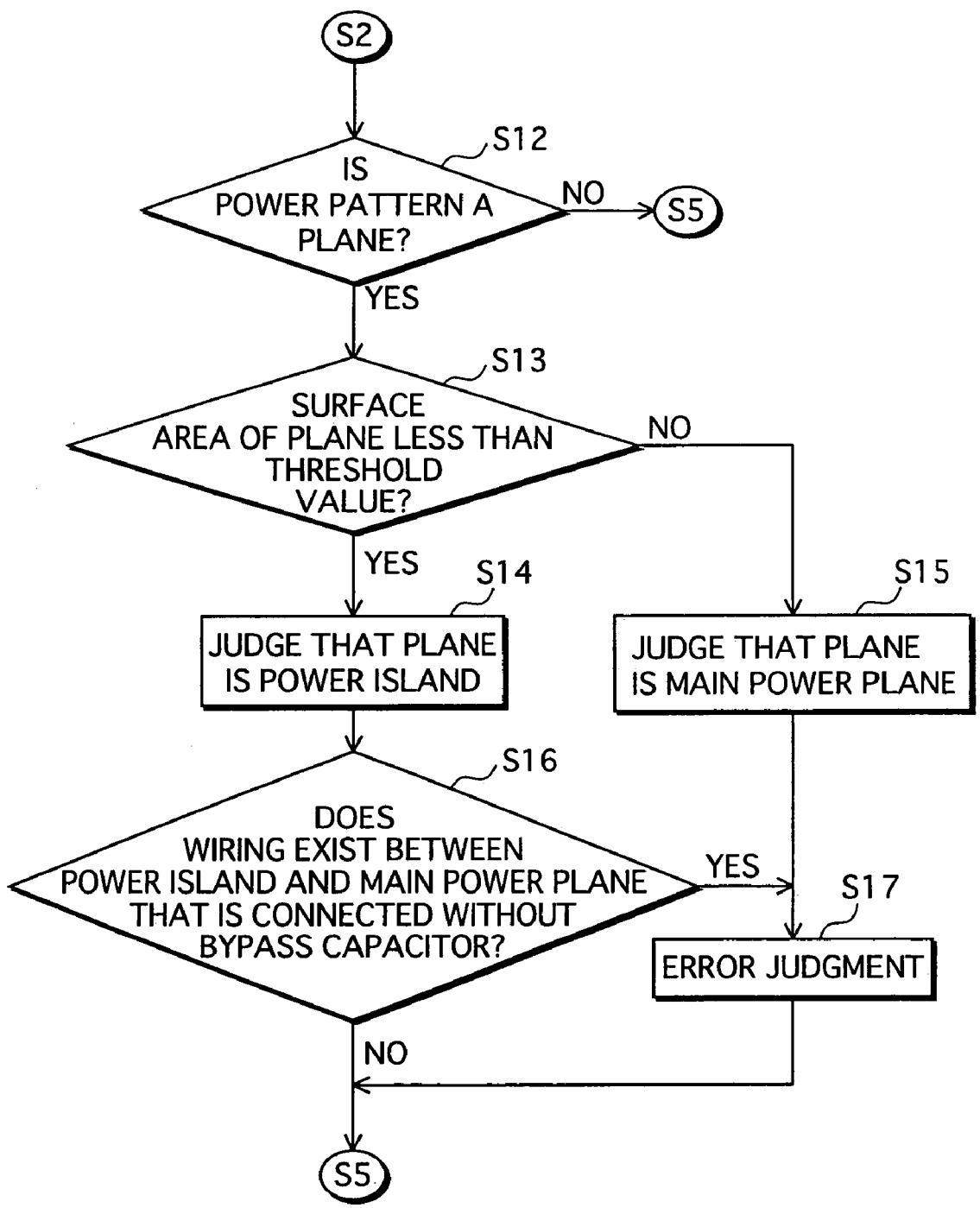
FIG. 15 is a flowchart for describing layout check processing of the second embodiment.

FIG. 15 is a flowchart for describing the layout check processing of the second embodiment. Only the operations that differ from the layout check processing of the first embodiment are described here.

Operations up to step S2 are the same as in the first embodiment. After step S2 the processing proceeds to step S12.

At step S12, the connection information analysis unit 126 analyzes whether the power pattern to which the power pin being focused on by the data retrieval unit 121 is a plane, and if so (step S12: YES), the processing proceeds to step S13. If the power pattern is not a plane (step S12: NO), the processing proceeds to step S5 described in the first embodiment.

At step S13, the power island judgment unit 125 judges whether the surface area of the power pattern is below a threshold value. If the surface area is below the threshold value (step S13: YES) the power island judgment unit 125 judges the power pattern to be a power island (step S14), and if the surface area is not below the threshold value (step S13: NO), the power island judgment unit 125 judges the power pattern to be a main power plane (step S15).

When the power pattern is judged to be a power island at step S14, the connection information analysis unit 126 analyzes whether wiring exists between the power island and the main power plane that is not connected via a bypass capacitor (step S16).

When wiring exists between the power island and the main power plane that is not connected via a bypass capacitor (step S16: YES), an error is judged to exist (step S17), and when such wiring does not exist (step S16: NO), the processing proceeds to step S5.

Furthermore, when the power pattern is judged to be a main power plane at step S15, an error is judged to exist (step S17), and the processing proceeds to step S5.

When the PCB layout shown in FIG. 11 is subject to the layout check processing, the power pattern 351 that directly connects the power island 1102 and the main power pattern 1101 without a bypass capacitor is detected according to the analysis by the connection information analysis unit 126, and therefore an error is judged to exist.

Specifically, the connection information analysis unit 126 performs this analysis by comparing diagram data (coordinate data expressing a diagram) of the power island 1102 and the main power pattern, and coordinates of two power vias provided on the power pattern 351, to find out whether the coordinates of the two power vias are arranged on the area shown by the diagram data of the power island 1102 and the area shown by the diagram data of the main power pattern 1101, respectively and if so, an error is judged to exist.

Additional Remarks

Note that the present invention is not limited to the described embodiments and modifications. Cases such as the following are included in the present invention.

(1) In the layout check processing described in the first embodiment, even when an error is judged to have occurred in the connection relation between a particular power pin (a first power pin) and a particular bypass capacitor (a first bypass capacitor), the connection relation between the first power pin and other bypass capacitors is checked. However, when an error exists in the connection relation between the first power pin and the first bypass capacitor, the first bypass capacitor may be excluded from subsequent checking in order to increase the speed of the layout check processing.

(2) In the first embodiment, the power pins subject to checking are described as being power pins of a high-speed IC, but power pins of a connector or a component designated by the user may be subject to checking.

Furthermore, in the first embodiment the check of the power pins and bypass capacitors is described as being performed in a "round robin" order of combinations, but the check may be performed in combinations of power pins and bypass capacitors designated by the user.

(3) The check may be performed by dividing the bypass capacitors subject to checking into high frequency bypass capacitors and low frequency bypass capacitors, and retrieving information of the two types separately.

(4) In the first embodiment the error information is output to the display unit 14, but instead may be output to the storage unit 13. Alternatively, if the layout check system is connected to a network, the error information may be output to another device in the network.

(5) In the first embodiment, the wiring path distance Z1 between a power pin and a power via is compared to the wiring path distance Z2 between a power pin and a bypass capacitor, and an error judged to exist if Z1 is less than Z2. However, an error may be judged to exist when $Z1+\alpha<Z2$. Here, $\alpha$ may be a designated value input by the user, or may be a value set in the system.

(6) The present invention may be a layout check method including the procedures (shown in FIGS. 5, 6, 7, and 15) of the described layout check processing. Furthermore, the present invention may be a program for having the layout check processing executed by a computer, or may be a digital signal expressing the program.

(7) The present invention may be the program or the digital signal recorded on a computer-readable recording medium such as a flexible disk, a hard disk, a CD-ROM, an MO, a DVD, a DVD-ROM, a DVD-RAM, a BD (Blu-ray Disc), and a semiconductor memory.

(8) The present invention may be the program or the digital signal transferred over a telecommunication line, a wireless or wired communication line, or a network such as the Internet.

(9) The present invention may be executed in another independent computer system by transporting the recording medium with the program or the digital signal recorded thereon, or by conveying the program or digital signal via the network.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A layout check system that checks layout data that defines a layout of a power source, a component that includes a power pin, and a bypass capacitor on a printed wiring board, comprising:
   a storage unit operable to store the layout data, the layout data including information used for calculating a first value and a second value, the first value corresponding to impedance between the power pin and the power source, and to second value corresponding to impedance between the power pin and the bypass capacitor;
   a calculation unit operable to calculate, with use of the layout data, a shortest wiring distance between the power pin and the power source as a first value, and a shortest wiring distance between the power pin and the bypass capacitor as a second value;
   a judgment unit operable to judge, by comparing the first value with the second value, that the layout does not allow the bypass capacitor to function effectively if the first value is less than the second value; and
   an output unit operable to output error information when a result of the judgment is negative,
   wherein when a power via exists on wiring that connects the power pin and the bypass capacitor, the calculation unit calculates, with use of the layout data, a shortest wiring distance between the power pin and the power via as the first value, and the shortest wiring distance between the power pin and the bypass capacitor as the second value.

2. A layout check system that checks layout data that defines a layout of a power source, a component that includes a power pin, and a bypass capacitor on a printed wiring board, comprising:
   a storage unit operable to store the layout data, the layout data including (a) information used for calculating a first value and a second value, the first value corresponding to impedance between the power pin and the power source, and the second value corresponding to impedance between the power pin and the bypass capacitor, (b) type information that indicates whether wiring is a line or a plane, and (c) area information indicating a surface area of the plane, and further operable to store a prescribed value;
   a calculation unit operable to calculate the first value and the second value, with use of the stored layout data;
   a judgment unit operable to judge, by comparing the first value with the second value, whether the layout allows the bypass capacitor to function effectively;
   an output unit operable to output error information when a result of the judgment is negative;
   an analysis unit operable to analyze, with use of the type information, whether wiring that connects the power pin and the bypass capacitor is a line or a plane; and
   a power plane judgment unit operable to judge, when a result of the analysis indicates that the wiring that connects the power pin and the bypass capacitor is a plane, whether the surface area of the plane is less than the prescribed value, by referring to the area information, and when the surface area is less than the prescribed value, judge that the plane is a specific power plane, wherein
   when the power plane judgment unit judges the wiring to be the specific power plane, the analysis unit further analyzes, with use of the layout data, whether the specific power plane and the power source are connected without a bypass capacitor therebetween, and when a result of the analysis indicates that the specific power plane and the power source are connected without a bypass capacitor therebetween, judge that the layout is not a layout that allows a bypass capacitor to function effectively.

3. A layout check method for checking layout data that defines a layout of a power source, a component that includes a power pin, and a bypass capacitor on a printed wiring board, comprising:
   an obtaining step of obtaining layout data, the layout data including (a) information used for calculating a first value and a second value, the first value corresponding to impedance between the power pin and the power source, and the second value corresponding to impedance between the power pin and the bypass capacitor, (b) type information that indicates whether wiring is a line or a plane, and (c) area information indicating a surface area of the plane, and further operable to store a prescribed value;
   a calculation step of calculating the first value and the second value, with use of the layout data;
   a judgment step of judging, by comparing the first value with the second value, whether the layout allows the bypass capacitor to function effectively;
   an output step of outputting error information when a result of the judgment is negative;
   an analysis step of analyzing, with use of the type information, whether wiring that connects the power pin and the bypass capacitor is a line or a plane; and
   a power plane judgment step of judging, when a result of the analysis indicates that the wiring that connects the power pin and the bypass capacitor is a plane, whether the surface area of the plane is less than the prescribed value, by referring to the area information, and when the surface area is less than the prescribed value, judge that the plane is a specific power plane, wherein
   when the power plane judgment step judges the wiring to be the specific power plane, the analysis step further analyzes, with use of the layout data, whether the specific power plane and the power source are connected without a bypass capacitor therebetween, and when a result of the analysis indicates that the specific power plane and the power source are connected without a bypass capacitor therebetween, judges that the layout is not a layout that allows a bypass capacitor to function effectively.

4. A program stored in a computer readable medium that has a computer execute layout check processing for checking layout data that defines a layout of a power source, a component that includes a power pin, and a bypass capacitor on a printed wiring board, comprising:

an obtaining step of obtaining layout data, the layout data including (a) information used for calculating a first value and a second value, the first value corresponding to impedance between the power pin and the power source, and the second value corresponding to impedance between the power pin and the bypass capacitor, (b) type information that indicates whether wiring is a line or a plane, and (c) area information indicating a surface area of the plane, and further operable to store a prescribed value;

a calculation step of calculating the first value and the second value, with use of the layout data;

a judgment step of judging, by comparing the first value with the second value, whether the layout allows the bypass capacitor to function effectively;

an output step of outputting error information when a result of the judgment is negative;

an analysis step of analyzing, with use of the type information, whether wiring that connects the power pin and the bypass capacitor is a line or a plane; and a power plane judgment step of judging, when a result of the analysis indicates that the wiring that connects the power pin and the bypass capacitor is a plane, whether the surface area of the plan is less than the prescribed value, by referring to the area information, and when the surface area is less than the prescribed value, judge that the plane is a specific power plane, wherein when the power plane judgment step judges the wiring to be the specific power plane, the analysis step further analyzes, with use of the layout data, whether the specific power plane and the power source are connected without a bypass capacitor therebetween, and when a result of the analysis indicates that the specific power plane and the power source are connected without a bypass capacitor therebetween, judges that the layout is not a layout that allows a bypass capacitor to function effectively.

5. A method for checking the effectiveness of a bypass capacitor in a circuit board layout, comprising the steps of:

reading information about a power source, a bypass capacitor, an integrated circuit (IC) power pin and wiring connections between them, including whether a line or a plane comprises the wiring and surface area of the plane;

determining from the information if the bypass capacitor and the IC power pin have a common power node;

calculating, when a common power node exists, an impedance from the common power node to the bypass capacitor from the information;

calculating, when a common power node exists, an impedance from the common power node to the IC power pin from to information;

comparing the impedance of the common power node to the bypass capacitor with the impedance from the power node to the IC power pin; and outputting an output result of the comparison;

whereby the output determines whether the bypass capacitor in the circuit board layout will be effective at suppressing parasitic noise and power fluctuations at the IC power pin.

6. The method of claim 5 wherein the common power node is at one end of a power via.

7. The method of claim 5 wherein the output is an error message if the common power node to IC power pin impedance is larger than the common power node to the bypass capacitor impedance.

8. The method of claim 5 wherein the circuit board layout impedances are calculated by using line lengths of the wiring connections.

9. The method of claim 8 wherein the result is an error message if the common power node to IC pow pin line length is longer than the common power node to the bypass capacitor line length.

10. The method of claim 5 further comprising the steps of:

reading information about all bypass capacitors in the circuit board layout;

determining if each bypass capacitor and the IC power pin have a common power node;

calculating the impedances for each common power node to each respective bypass capacitor;

calculating the impedances from each common power node to the IC power pin;

comparing to impedances from each common power node to the IC pow pin with the respective impedances for each common power node to each respective bypass capacitor; and outputting the result of the comparisons.

* * * * *

UNITED STATES PATENT AND TRADEMARK OFFICE
CERTIFICATE OF CORRECTION

PATENT NO. : 7,117,459 B2  Page 1 of 1
APPLICATION NO. : 10/719774
DATED : October 3, 2006
INVENTOR(S) : Tanimoto et al.

It is certified that error appears in the above-identified patent and that said Letters Patent is hereby corrected as shown below:

In the Claims:
Column 17, line 32, "plan" should be --plane--.
Column 18, line 11, "to" should be --the--.
Column 18, line 30, "pow" should be --power--.

Signed and Sealed this

Twenty-third Day of January, 2007

JON W. DUDAS
*Director of the United States Patent and Trademark Office*